United States Patent [19]

Van Roijen et al.

[11] Patent Number: 5,759,872
[45] Date of Patent: Jun. 2, 1998

[54] METHOD OF MANUFACTURING AN OPTOELECTRONIC SEMICONDUCTOR DEVICE, IN PARTICULAR A SEMICONDUCTOR DIODE LASER

[76] Inventors: Raymond Van Roijen, Fisher Pond Rd., Yorktown Heights, N.Y. 10598; Petrus J.A. Thijs; Patrick H. Van Gestel, both of Groenewoudseweg 1, 5621 BA Eindhoven, Netherlands

[21] Appl. No.: 634,536

[22] Filed: Apr. 18, 1996

[30] Foreign Application Priority Data

Apr. 19, 1995 [EP] European Pat. Off. ............ 95200986

[51] Int. Cl.⁶ ........................... H01S 3/19; H01L 23/00
[52] U.S. Cl. ........................ 438/23; 438/38; 438/44; 438/47
[58] Field of Search .......................... 438/22, 29, 38, 438/39, 41, 42, 44, 46, 47, 93, 94

[56] References Cited

U.S. PATENT DOCUMENTS 5,063,173  11/1991  Gasser et al. ...................... 438/47
5,177,031   1/1993  Buchmann et al. ................. 438/47
5,550,081   8/1996  Holonyak, Jr. et al. ............ 438/47

FOREIGN PATENT DOCUMENTS

0613222A1  8/1994  European Pat. Off. .

*Primary Examiner*—Charles L. Bowers, Jr.
*Assistant Examiner*—Keith Christianson

[57] ABSTRACT

A passive region is provided adjacent the mirror surface of a laser. A mesa is formed with an end face parallel to the mirror surface to be formed. The passive region is grown against the end face, and the mirror surface is formed therein by cleaving. The passive region is provided exclusively at the area of the active region. The passive region is provided at the area of the active region preferably in the following manner: two depressions are formed in the layer structure of the laser at the area of the mirror surface to be formed, reaching down to the active layer. Then a portion of the active layer situated between the depressions is selectively removed, whereupon the passive region is grown starting from the depressions in the tubular cavity thus formed.

12 Claims, 4 Drawing Sheets

METHOD OF MANUFACTURING AN OPTOELECTRONIC SEMICONDUCTOR DEVICE, IN PARTICULAR A SEMICONDUCTOR DIODE LASER

BACKGROUND OF THE INVENTION

The invention relates to a method of manufacturing an optoelectronic semiconductor device with a semiconductor body which comprises a semiconductor substrate, which method serves to provide on a first semiconductor region of a first semiconductor material forming part of the semiconductor body a second semiconductor region of a second semiconductor material different from the first, a third semiconductor region of a third semiconductor material different from the first being provided adjacent the first semiconductor region by means of a growing process.

Various optoelectronic devices such as radiation waveguides, photodiodes, LEDs (=Light Emitting Diodes) and in particular semiconductor diode lasers, which includes semiconductor diode laser amplifiers, are manufactured by such a method in III–V or II–VI semiconductor bodies. The devices mentioned last, often referred to as lasers for short, are used inter alia as components in the read and/or write heads of information-processing units such as laser printers, bar code readers, and reading and/or writing devices for optical registration carriers such as CD (Audio) and CDROM (Data) discs, and as transmitters or amplifiers in systems for optical glass fiber communication.

Such a method is known from a European Patent Application published under No. 0.613.222 on 31-8-1994. The method therein is used for the manufacture of a laser with a semiconductor body comprising an InP substrate. On a first semiconductor region of InGaAsP, which forms the active region of the laser, a second semiconductor region of InP, which forms a confinement region of the laser, is provided. A mesa is then formed in the semiconductor body and a third, passive semiconductor region of InP is provided in a growing process against an end face into which the active region issues. A mirror surface is formed in the center of the latter InP region by means of cleaving, which mirror surface is now separated from the active region by a passive region. Such a passive mirror region has important advantages.

A disadvantage of the known method is that the laser manufactured thereby has a high starting current and a short useful life, as well as an irregular pattern in the emitted or amplified radiation. This is obviously undesirable.

SUMMARY OF THE INVENTION

The present invention has for its object inter alia to provide a method which does not have said disadvantage, or at least to a much lesser degree, and which accordingly results in lasers having a low starting current, a long useful life, and a regular pattern of the emitted or amplified radiation, and which are at the same time uncomplicated.

According to the invention, a method of the kind mentioned in the opening paragraph is for this purpose characterized in that two depressions are formed in the semiconductor body, which depressions extend from the surface of the semiconductor body at least down to the first semiconductor region, a portion of the first, layer-shaped semiconductor region situated between the depressions is removed, starting from the depressions, by means of etching with an etchant which is selective relative to the second semiconductor material, whereby an interconnection is formed between the two depressions within the semiconductor body, and said interconnection is filled up with the third semiconductor material by means of the growing process from the two depressions, whereby the third semiconductor region is formed. The invention is based on the surprising recognition that the above problems are related to nucleation problems in the manufacture of the third semiconductor region. The invention is also based on the recognition that the gravity of the effects of nucleation problems is related to the comparatively great, or at least comparatively high dimension of the end face against which the growing process takes place. It is indeed in this end face, below the active layer forming the first semiconductor region in the case of a laser, that a comparatively thick cladding layer and often also a portion of the substrate are present. Defects arising at the start of the growing process may have become large at the area of the active layer. These problems arise in particular when the end face is parallel to a (–110) crystal direction, which is often a preferred direction in practice. In the method according to the invention, the end face against which the third semiconductor region is provided is limited to a side face of the first semiconductor region, which is often comparatively thin. Judiciously, a portion is removed of that region only, and the removed portion is replaced with the third semiconductor material which will form the third semiconductor region. Since the surface against which the growing process takes place is of minimum dimensions, at least of minimum height, the influence of nucleation problems is a minimum. As a result, devices manufactured by the method according to the invention have a regular pattern of their emitted or amplified radiation and, in the case of lasers, a low starting current and a long useful life.

In a first embodiment of a method according to the invention, the second semiconductor region is formed as a confinement region, and the two depressions are provided on either side of a strip-shaped active or radiation-guiding region to be formed in the first semiconductor region and at the area of a radiation input or output surface to be formed. This method is particularly suitable for providing lasers of the so-called gain-guided type, such as an oxide strip laser, with a passive mirror region. For example, two square depressions situated at a small distance from one another are etched into a planar double heterostructure in that case. Two sides of the squares run parallel to the strip-shaped active region to be formed, the other two run parallel to a mirror surface to be formed whose position coincides with a centerline through the two depressions. After formation of the third semiconductor region (and possibly filling of the depressions by growing), for example, an $SiO_2$ layer is provided with a strip-shaped opening lying between the depressions (which may or may not have been filled up). Over this assembly, and against the substrate, a metal layer is provided, after which two mirror surfaces are formed by cleaving.

In a preferred embodiment of a method according to the invention, a strip-shaped mesa is formed in the surface of the semiconductor body, which mesa comprises at least the second semiconductor region, and a masking layer is provided over and on either side of the strip-shaped mesa and is provided with a strip-shaped opening which crosses the strip-shaped mesa substantially perpendicularly and within which the depressions are defined on either side of the mesa. Such a method is particularly suitable for the manufacture of radiation waveguides or lasers of the so-called index-guided type, which devices are often characterized by strip-shaped mesas in or under which the active regions are formed.

A favorable modification thereof, whereby a laser is manufactured, is characterized in that the following are provided in that order on a semiconductor substrate of a first conductivity type: a first cladding layer of the first conductivity type, an active layer forming the first semiconductor region, and a second cladding layer of a second conductivity type opposed to the first and forming the second semiconductor region, whereupon the strip-shaped mesa is formed, preferably by etching down into the substrate, and the masking layer with the opening is provided, after which the interconnection is formed, the masking layer is removed and a third, preferably current-blocking cladding layer is grown on either side of the mesa, whereby initially the third semiconductor region is formed, and finally the second cladding layer and the substrate are provided with a first and with a second conductive layer, respectively, and the semiconductor body is cleaved at the area of the third semiconductor region so as to form a mirror surface. With this comparatively simple modification of the method, lasers with a SIPBH (=Semi Insulating Planar Buried Hetero) structure are obtained which are particularly suitable for use as transmitters or amplifiers in an optical glass fiber communication system. The mirror surfaces of the laser are provided with an anti-reflection coating for the application as an amplifier.

Preferably, the active layer is constructed as a (multi) quantum well layer, while between the active layer and the first or second cladding layer a comparatively thick separate confinement layer or radiation-guiding layer is provided of which also a portion situated between the depressions is selectively removed during the formation of the interconnection, whether or not in a separate etching step, which portion is also replaced with the semiconductor material of the third cladding layer. A comparatively thick separate confinement layer or radiation-guiding layer is desired for many applications. It also facilitates the formation and refilling by growth of the interconnection when the active layer has a (multi)quantum well structure and is accordingly comparatively thin. A radiation-guiding layer, if present, may be advantageously provided with a grating for obtaining a laser (amplifier) of the DFB (=Distributed Feed Back) type.

Preferably, furthermore, n-InP is used as the semiconductor material for the semiconductor substrate, p-InP for the second cladding layer, high-ohmic InP for the third cladding layer, InGaAs or InGaAsP for the active layer and a separate confinement layer or radiation-guiding layer, if present, and p-InGaAs or p-InGaAsP for a contact layer situated between the second cladding layer and the first conductive layer. With this choice of materials, devices are obtained which can be used in practical optical glass fiber communication systems.

Preferably, furthermore, the length, width, and thickness of the interconnection are chosen such that they lie between 1 and 10 μm, between 10 and 40 μm, and between 0.1 and 1 μm, respectively. Such a length and thickness provide a good possibility for etching the interconnection and filling it by growing again. Such a width is particularly suitable for the formation of a passive mirror region because it approximately corresponds to twice the inaccuracy in the position of a mirror surface to be formed by cleaving.

MOVOPE (=Metal Organic Vapour Phase Epitaxy) is preferably used as the growing technique for the semiconductor layers. This technique is highly suitable inter alia for filling up the interconnection.

BRIEF DESCRIPTION OF THE DRAWING

The invention will now be explained in more detail with reference to an embodiment and the accompanying drawing, in which.

DETAILED DESCRIPTION OF THE PREFERRED EMBODIMENTS

The Figures are diagrammatic and not drawn true to scale, the dimensions in the thickness direction being particularly exaggerated for greater clarity. Portions of adjacent, identical lasers are not depicted in the Figures for the sake of simplicity.

Figure 1:
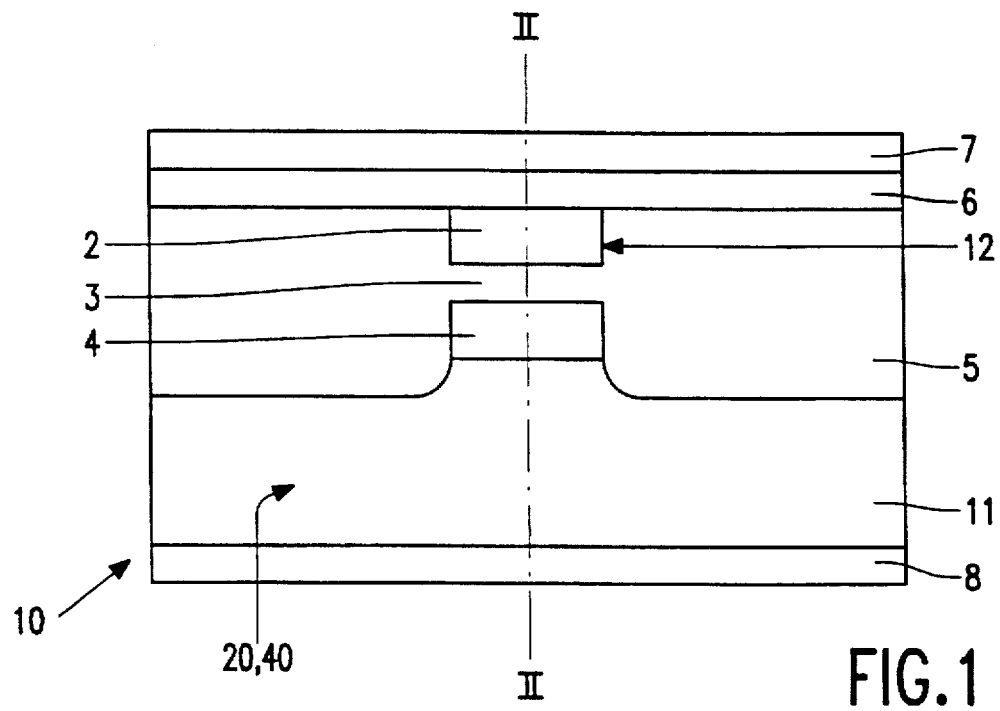
FIG. 1 shows a semiconductor diode laser manufactured by a method according to the invention diagrammatically and in front elevation.
Figure 2:
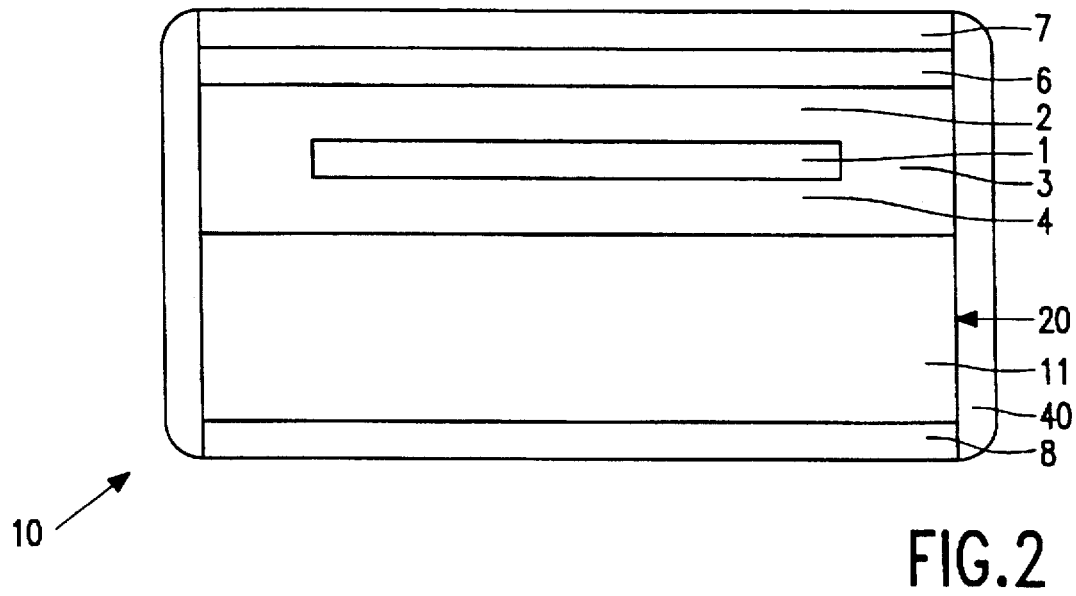
FIG. 2 shows the semiconductor diode laser of FIG. 1 diagrammatically and in a cross-section taken on the line II—II, and FIGS. 3 to 9 diagrammatically show the semiconductor diode laser of FIG. 1 in consecutive stages of its manufacture by a method according to the invention in front elevation, in perspective view (FIGS. 5 and 6), or in cross-section (FIG. 9).
Figure 3:
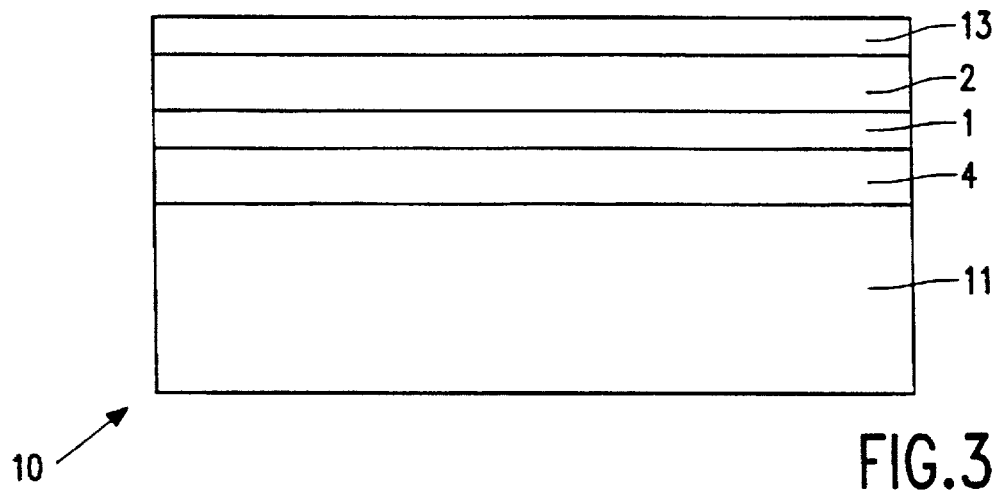
Figure 4:
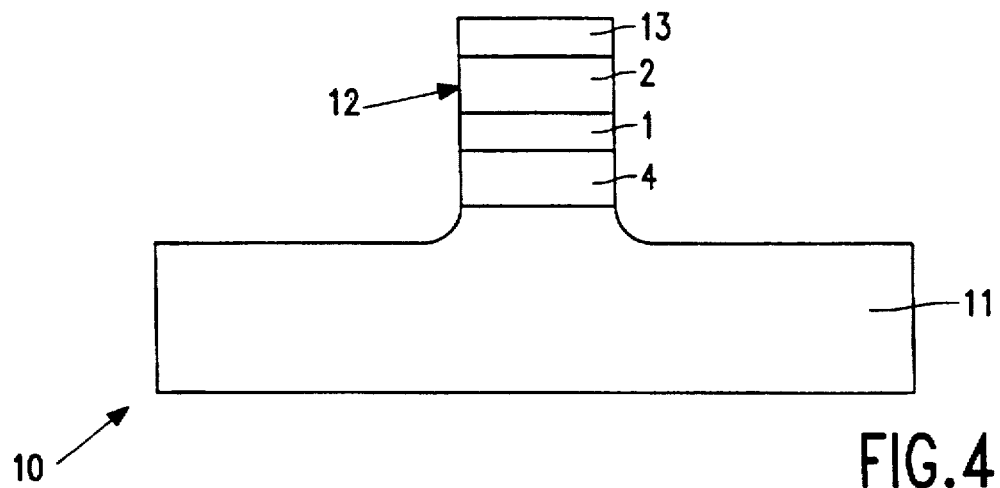
Figure 5:
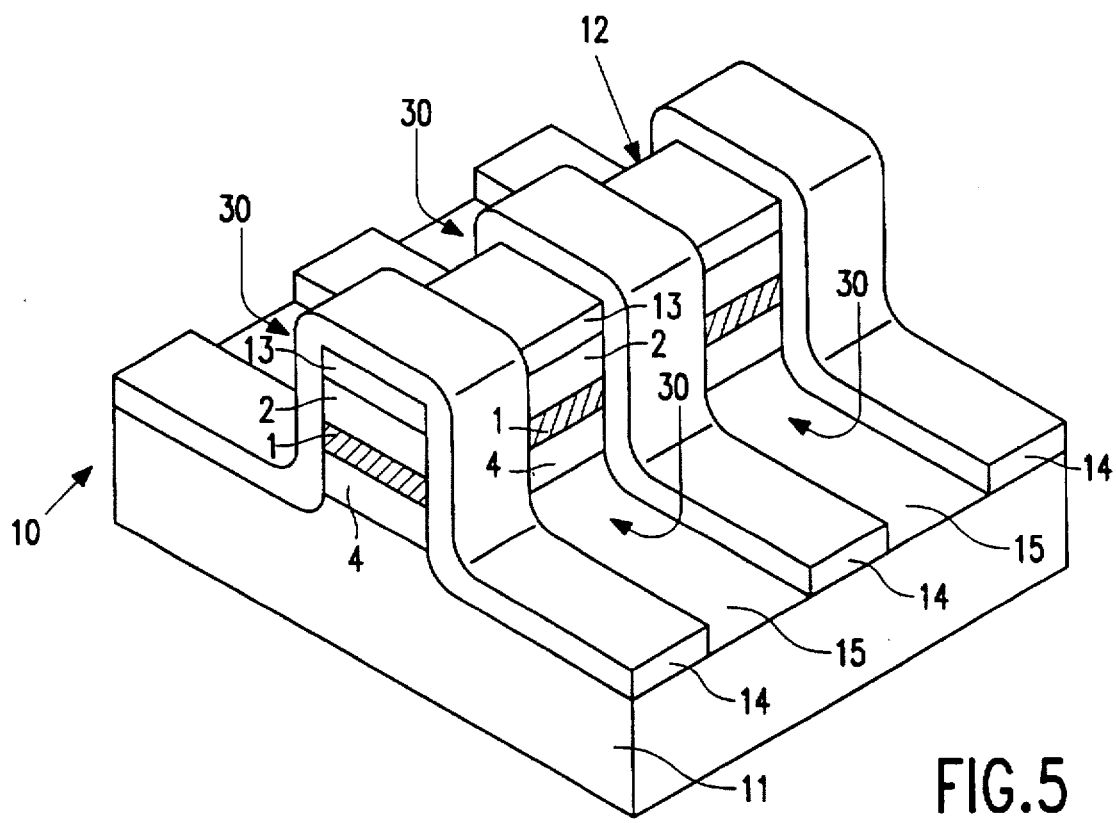
Figure 6:
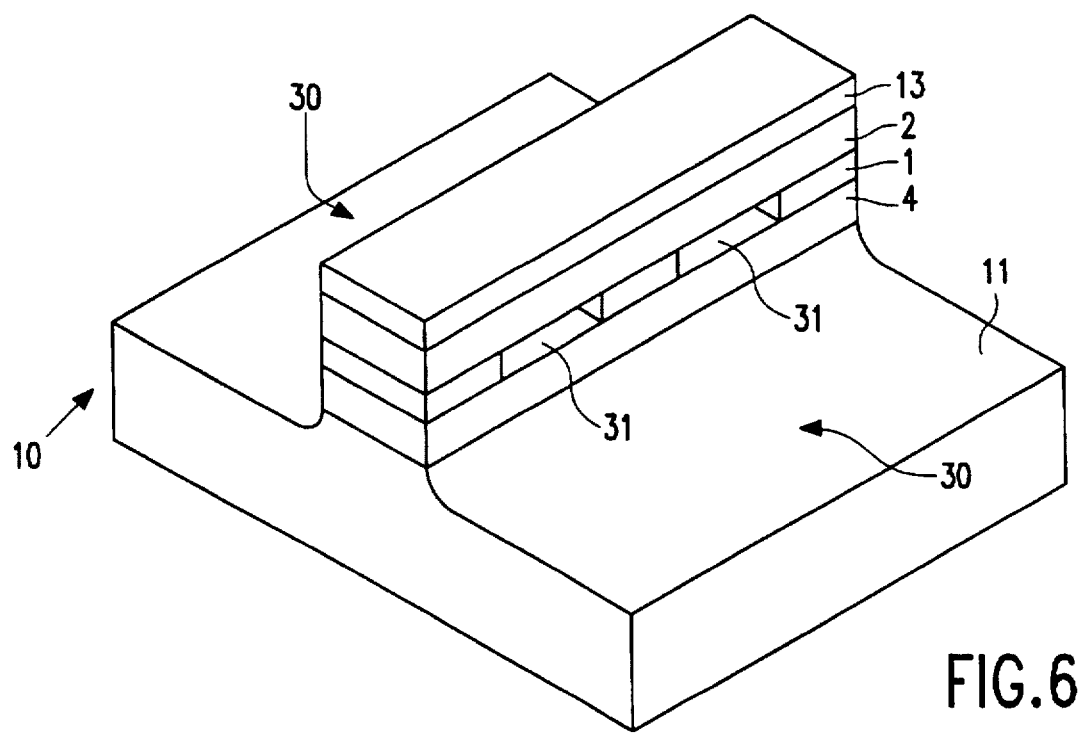

FIG. 1 diagrammatically shows in front elevation an optoelectronic semiconductor device, here a semiconductor diode laser, manufactured by a method according to the invention. A diagrammatic cross-section of the laser of FIG. 1 taken on the line II—II is shown in FIG. 2. The laser (see FIG. 1) comprises a semiconductor body 10 with a substrate 11, in this example of a first, here the n-conductivity type, provided with a metal layer 8, on which substrate a semiconductor layer structure is present with (see FIG. 2) an active layer 1 lying between two cladding layers 2, 4 and having a pn junction, here between the cladding layers 2 and 4 which in this example are of the first and of a second conductivity type opposed to the first, here the p-type, respectively. Given a sufficient current strength in the forward direction, the pn junction is capable of generating electromagnetic radiation within a strip-shaped active region 1 of the active layer 1 lying within a strip-shaped mesa 12. A third cladding layer 5, of high ohmic value here, is present on either side of the mesa 12. Near two end faces 20 of the laser and next to the active region 1 there is a passive region 3 which here again comprises high-ohmic InP and prevents, or at least strongly suppresses degradation of the laser at the end face 20. The end faces 20 in this example are provided with an anti-reflection layer 40, here a ¼ λ hafnium oxide layer 40, so that the laser is suitable for use as an amplifier. Current passage is possible thanks to the metal layer 8 mentioned above and a contact layer 6 and metal layer 7 present on the second cladding layer 2.

FIGS. 3 to 9 diagrammatically show in front elevation, in perspective view (FIGS. 5 and 6), or in cross-section (FIG. 9) the semiconductor diode laser of FIG. 1 in consecutive stages of its manufacture by a method according to the invention. Manufacture starts (see FIG. 3) with the provision of the following semiconductor layers by means of LPE (=Liquid Phase Epitaxy) on a 360 μm thick substrate 11 with a (100) orientation made from n-InP with a doping of $5 \times 10^{18}$ Si atoms/cm$^3$: a 1 μm thick first cladding layer 4 of n-type InP with a doping of $2 \times 10^{18}$ Si atoms/cm$^3$, a 0.15 μm thick, not intentionally doped active layer 1 of $In_{0.57}Ga_{0.43}As_{0.91}P_{0.09}$ (λ=1.55 μm) which forms the first semiconductor region 1, and a 1 μsecond cladding layer 2 of p-type InP with a doping of $5 \times 10^{17}$ Zn atoms/cm$^3$ which forms the second semiconductor region 2. After removal from the growing apparatus, a masking layer 13 of $SiO_2$ is provided, for example by sputtering, and given a strip-shaped pattern 13 by photolithography.

Then (see FIG. 4) the portions of the semiconductor layer structure situated outside the mask 13 and 1 μm of the substrate 11 are removed by etching, in this case RIE (=Reactive Ion Etching), whereby a strip-shaped mesa 12 is formed which reaches down into the substrate 11.

Subsequently (see FIG. 5) a masking layer 14 of $Si_3N_4$ is provided and given at least one strip-shaped opening 15 by means of photolithography, here two openings 15 which cross the mesa 12 perpendicularly and within which two depressions 30 are formed each time on either side of the mesa 12. The depressions 30 extend from the surface of the semiconductor body 10 down to at least the first semiconductor region 1, here the active layer 1, and in the present example even down into the substrate 11. The strip-shaped openings 15 are present at the areas of input or output surfaces for radiation to be formed. According to the invention, starting from the depressions 30, a portion of the first semiconductor region 1 situated therebetween, here the active region 1, is removed in that $In_{0.57}Ga_{0.43}As_{0.91}P_{0.09}$ is etched away by means of an etchant which is selective relative to the second semiconductor material, which here comprises InP. Such a selective etchant is, for example, a mixture of $K_3Fe(CN)_6$ (12 mole % in $H_2O$) and KOH (20 mole % in $H_2O$), the volume ratio of the constituent parts being 1:1.

Figure 7:
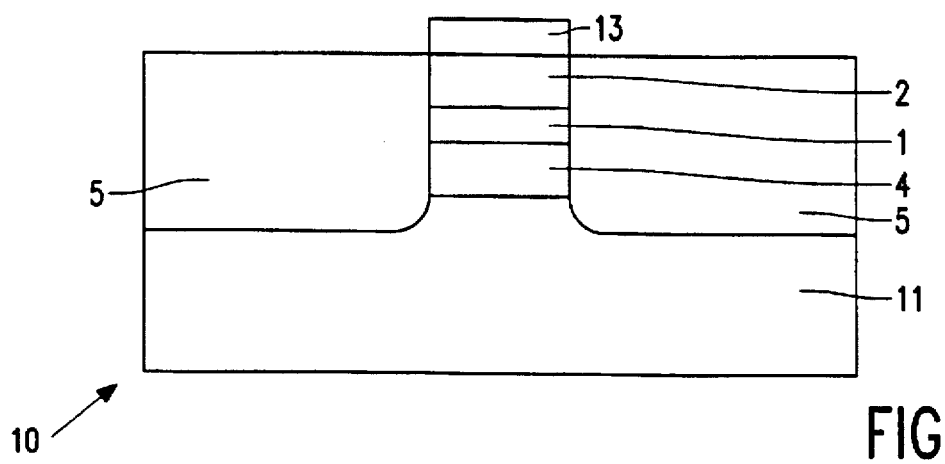

A hollow interconnection 31 (see FIG. 6) is formed thereby inside the semiconductor body 10 between two juxtaposed depressions 30. The masking layer 14 is subsequently removed, so that the four depressions 30 are combined into two strip-shaped depressions (30) on either side of the mesa 12. Subsequently, still in accordance with the invention, the interconnection 31 is filled up starting from the depressions 30 with a third semiconductor material, here also InP, in a growing process, here the MOVPE growing process, so that the third semiconductor region 3 is formed. The deposited InP is high-ohmic and accordingly current-blocking. The depressions 30 are completely filled up here with the same material as that of the third semiconductor region 3. In the same growing process, a third cladding layer 5 also of high-ohmic InP, and accordingly also current-blocking, is formed in the depressions 30 on either side. A front elevation of the resulting structure is shown in FIG. 7. Since the formation of a passive mirror region 3 will take place only against a surface with a very small height, i.e. no more than the thickness of the active layer 1, the influence of nucleation problems is small and devices are obtained with a regular pattern of the emitted or amplified radiation and, in the case of lasers, with a low starting current and a long useful life.

After removal of the mask 13 and cleaning in a usual manner, the structure obtained is brought into the MOVPE growing apparatus again (see FIG. 8), and an approximately 1 μm thick contact layer 6 of p-type $In_{0.57}Ga_{0.43}As_{0.91}P_{0.09}$ with a doping of $1×10^{19}$ Zn atoms/cm$^3$ is provided over the entire upper surface. After the structure thus obtained has been taken from the growing apparatus, the thickness of the substrate is reduced to approximately 100 μm, and metal layers 7, 8 of usual composition are provided in a usual manner on the upper and lower sides of the semiconductor body 10, so that current connections for the laser can be made thereon.

Figure 8:
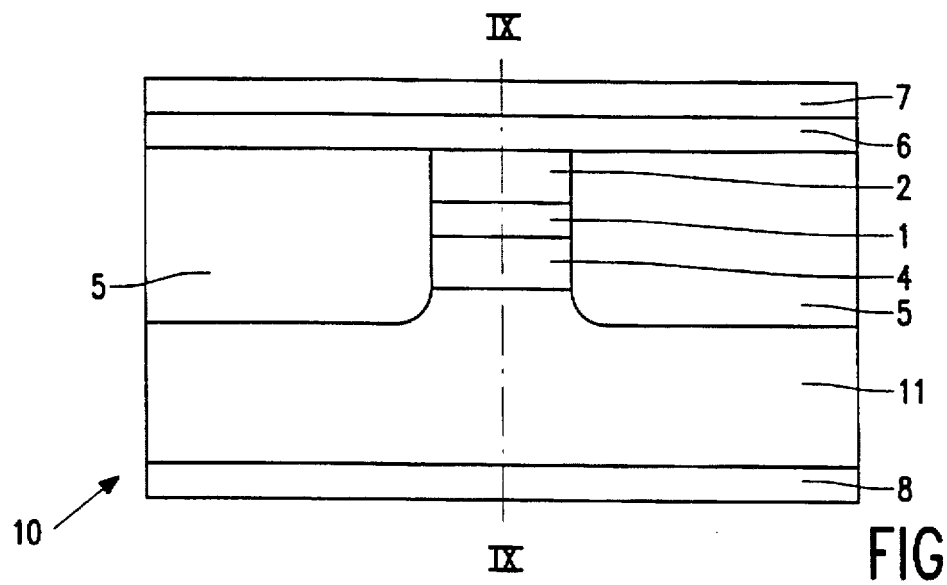
Figure 9:
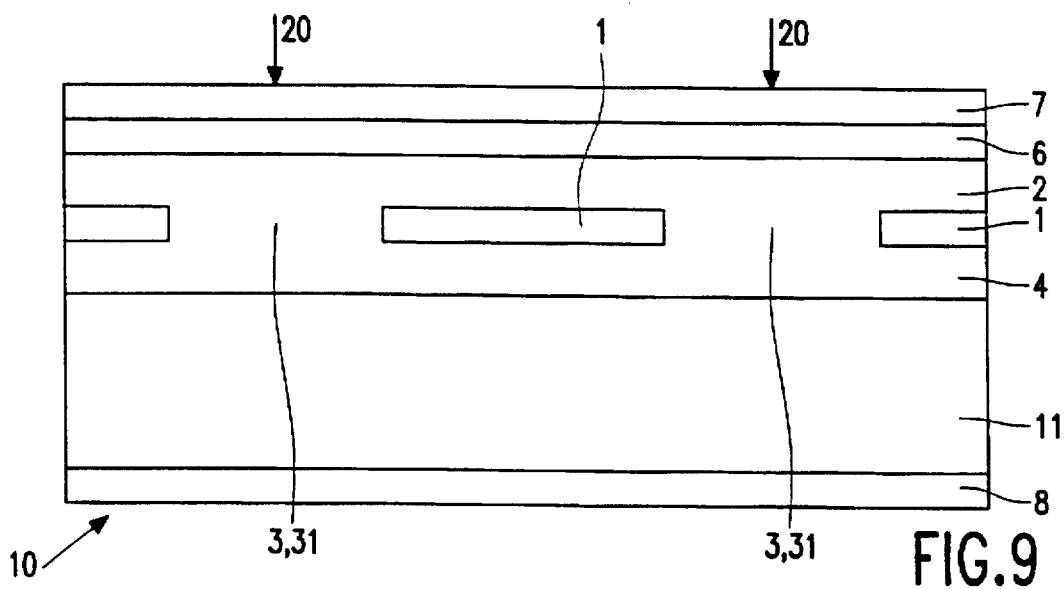

A cross-section of the resulting structure taken on the line IX—IX in FIG. 8 is shown in FIG. 9. The semiconductor body 10 is subsequently cleaved in the spots indicated with 20 in FIG. 9, and a ¼ λ layer 40 of hafnium oxide is provided on the mirror surfaces 20, for example, by means of sputtering or vapour deposition. Finally, individual lasers suitable for final mounting (see FIGS. 1 and 2) are obtained by cleaving of the semiconductor body 10 between adjoining mesas 12.

A favorable modification of the embodiment discussed above involves the provision of a not intentionally doped radiation-guiding layer (not shown in the Figures), for example of $In_{0.72}Ga_{0.28}As_{0.60}P_{0.40}$ (λ=1.3 μm) and with a thickness of approximately 0.15 μm between the first cladding layer 4 and the active layer 1. A portion of this layer situated between the depressions 30 may be removed before, after, or simultaneously with the portion of the active layer 1 to be removed. A grating may advantageously be formed in the first cladding layer 4 (which may also coincide with the substrate 11) in usual manner, so that the laser (amplifier) obtained is of the DFB type. Further particulars on this can be found in, for example, the cited EP-A 0.632.222. In a different favorable modification (also not shown in the Figures), the active layer 1 is constructed as a (multi) quantum well layer and is separated from the cladding layers 2, 4 by means of comparatively thick, for example 100 nm thick separate confinement layers with a bandgap lying between those of the active layer 1 and of the cladding layers 2, 4.

Opting for the InP/InGaAsP material system has the result that the laser (amplifier) obtained according to the embodiment is highly suitable for use in an optical glass fiber communication system. The length of the interconnection 31 corresponds to the width of the mesa 12 and is 2 μm here. The thickness of the interconnection 31 corresponds to the thickness of the active layer 1, and is accordingly 0.15 μm. A length and thickness lying between 1 and 10 μm and between 0.1 and 1 μm, respectively, facilitate the formation and filling-up of the interconnection 31. A width of the interconnection 31 lying between 10 and 40 μm, in this example a width of 20 μm, is highly suitable for cleaving therethrough. The inaccuracy during this process is in fact approximately ±10 μm. If, for example, the depressions 30 are no longer visible when the laser is finished, so-called alignment marks may be provided at suitable moments during manufacture.

The invention is not limited to the embodiments given, since many modifications and variations are possible to those skilled in the art within the scope of the invention. Thus thicknesses, semiconductor materials, compositions, or conductivity different types from those in the examples may be used. A semi-insulating substrate may alternatively be used as the substrate. It is especially noted that the invention may also be applied to the material systems GaAs/AlGaAs and InGaP/InAlGaP. If the depressions are formed by etching, it is possible to use one or several, whether or not selective, whether or not preferential, wet-chemical etchants instead of RIE. The depressions, however, need not necessarily be formed by etching. It is also possible to provide a mask (for example of $SiO_2$) before the growth of (part of) the semiconductor layers at the areas of the depressions to be formed, and to provide the (remaining) layers by means of selective epitaxy.

It is further noted that the invention may be used not only for the manufacture of the SIPBH laser described in the example, but also in the manufacture of a DCPBH (=Dual Channel Planar Buried Hetero) laser. The invention may be advantageously used also for other index-guided lasers such as those of the—possibly buried—ridge type. The same is true for lasers of the gain-guided type such as an oxide strip or proton-bombarded laser. The invention is by no means limited to lasers, nor to the manufacture of passive mirror regions. Thus, it is alternatively possible to interconnect two radiation guiding layers, which lie one above the other and are mutually separated by a passive layer, locally in that a portion of the interposed passive layer is replaced with the same semiconductor material as that of the radiation-guiding layers.

It is finally noted that instead of LPE and MOVPE as the growing process(es), it is also possible, for example, to use exclusively MOVPE. Other growing techniques such as VPE (=Vapour Phase Epitaxy) or MBE (=Molecular Beam Epitaxy), or the so-called mass transport technology, or combinations thereof, may be advantageously used.

What is claimed is:

1. A method of manufacturing an optoelectronic semiconductor device with a semiconductor body which comprises a semiconductor substrate, which method serves to provide on a first semiconductor region of a first semiconductor material forming part of the semiconductor body a second semiconductor region of a second semiconductor material different from the first, a third semiconductor region of a third semiconductor material different from the first being provided adjacent the first semiconductor region by means of a growing process, characterized in that two depressions are formed in the semiconductor body, which depressions extend from the surface of the semiconductor body at least down to the first semiconductor region, a portion of the first, layer-shaped semiconductor region situated between the depressions is removed, starting from the depressions, by means of etching with an etchant which is selective relative to the second semiconductor material, whereby an interconnection is formed between the depressions within the semiconductor body, and said interconnection is filled up with the third semiconductor material by means of the growing process from the two depressions, whereby the third semiconductor region is formed.

2. A method as claimed in claim 1, characterized in that the second semiconductor region, is formed as a confinement region, and the two depressions are provided on either side of a strip-shaped active or radiation-guiding region to be formed in the first semiconductor region and at the area of a radiation output surface to be formed.

3. A method as claimed in claim 2, characterized in that a strip-shaped mesa is formed in the surface of the semiconductor body by etching and with the aid of a mask, which mesa comprises at least the second semiconductor region, and a masking layer is provided over and on either side of the strip-shaped mesa and is provided with at least one strip-shaped opening which crosses the strip-shaped mesa substantially perpendicularly and within which the depressions are defined on either side of the mesa.

4. A method as claimed in claim 3, wherein the optoelectronic semiconductor device is constructed as a semiconductor diode laser, characterized in that the following are provided in that order on a semiconductor substrate of a first conductivity type: a first cladding layer of the first conductivity type, an active layer forming the first semiconductor region, and a second cladding layer of a second conductivity type opposed to the first and forming the second semiconductor region, whereupon the strip-shaped mesa is formed, preferably reaching down into the substrate, and the masking layer with the opening is provided, after which the interconnection is formed, the mask and the masking layer are removed and a third, preferably current-blocking cladding layer is grown on either side of the mesa, whereby simultaneously the third semiconductor region is formed, and the second cladding layer and the substrate are provided a first and a second conductive layer, respectively, and the semiconductor body is cleaved at the area of the third semiconductor region so as to form a mirror surface.

5. A method as claimed in claim 4, characterized in that the active layer is constructed as a (multi)quantum well layer, while between the active layer and the first or second cladding layer a comparatively thick separate confinement layer or radiation-guiding layer is provided of which also a portion situated between the depressions is selectively removed during the formation of the interconnection, whether or not in a separate etching step, which portion is also replaced with the semiconductor material of the third cladding layer.

6. A method as claimed in claim 5, characterized in that n-InP is used as the semiconductor material for the semiconductor substrate and the first cladding layer, p-InP for the second cladding layer, semi-insulating InP for the third cladding layer, InGaAs or InGaAsP for the active layer and a separate confinement layer or radiation-guiding layer, if present, and p-InGaAs or p-InGaAsP for a contact layer situated between the second cladding layer and the first conductive layer.

7. A method as claimed in claim 6, characterized in that the length, width, and thickness of the interconnection are chosen such that they lie between 1 and 10 µm, between 10 and 40 µm, and between 0.1 and 1 µm, respectively.

8. A method as claimed in claim 6, characterized in that organometallic gas phase epitaxy is chosen as the growing technique for the semiconductor layers.

9. A method as claimed in claim 1, characterized in that a strip-shaped mesa is formed in the surface of the semiconductor body by etching and with the aid of a mask, which mesa comprises at least the second semiconductor region, and a masking layer is provided over and on either side of the strip-shaped mesa and is provided with at least one strip-shaped opening which crosses the strip-shaped mesa substantially perpendicularly and within which the depressions are defined on either side of the mesa.

10. A method as claimed in claim 4, characterized in that n-InP is used as the semiconductor material for the semiconductor substrate and the first cladding layer, p-InP for the second cladding layer, semi-insulating InP for the third cladding layer, InGaAs or InGaAsP for the active layer and a separate confinement layer or radiation-guiding layer, if present, and p-InGaAs or p-InGaAsP for a contact layer situated between the second cladding layer and the first conductive layer.

11. A method as claimed in claim 1, characterized in that the length, width, and thickness of the interconnection are chosen such that they lie between 1 and 10 µm, between 10 and 40 µm, and between 0.1 and 1 µm, respectively.

12. A method as claimed in claim 1, characterized in that organometallic gas phase epitaxy is chosen as the growing technique for the semiconductor layers.

* * * * *